United States Patent
Bai

(10) Patent No.: US 10,469,174 B2
(45) Date of Patent: Nov. 5, 2019

(54) ANTI-INTERFERENCE SEMICONDUCTOR DEVICE FOR OPTICAL TRANSCEIVER

(71) Applicant: WINGCOMM CO. LTD., Jiangsu (CN)

(72) Inventor: Yun Bai, Jiangsu (CN)

(73) Assignee: WINGCOMM CO. LTD., Jiangsu (CN)

( * ) Notice: Subject to any disclaimer, the term of this patent is extended or adjusted under 35 U.S.C. 154(b) by 0 days.

(21) Appl. No.: 16/292,891

(22) Filed: Mar. 5, 2019

(65) Prior Publication Data

US 2019/0199441 A1    Jun. 27, 2019

Related U.S. Application Data

(63) Continuation of application No. PCT/CN2016/098105, filed on Sep. 5, 2016.

(51) Int. Cl.
| | |
|---|---|
| H01L 23/552 | (2006.01) |
| H04B 10/40 | (2013.01) |
| H01L 29/06 | (2006.01) |
| H01L 23/48 | (2006.01) |

(52) U.S. Cl.
CPC .......... *H04B 10/40* (2013.01); *H01L 23/481* (2013.01); *H01L 23/552* (2013.01); *H01L 29/06* (2013.01)

(58) Field of Classification Search
CPC combination set(s) only.
See application file for complete search history.

(56) References Cited

U.S. PATENT DOCUMENTS

| 8,395,191 B2* | 3/2013 | Or-Bach | H01L 21/76898 |
| | | | 257/213 |
| 9,023,688 B1* | 5/2015 | Or-Bach | H01L 23/3677 |
| | | | 257/E21.532 |
| 2005/0014329 A1* | 1/2005 | Williams | H01L 21/26513 |
| | | | 438/218 |

(Continued)

FOREIGN PATENT DOCUMENTS

| CN | 101359651 A | * | 2/2009 | ......... H01L 23/3135 |
| CN | 102446870 A | * | 5/2012 | ........... H01L 23/552 |

(Continued)

*Primary Examiner* — Omar S Ismail
(74) *Attorney, Agent, or Firm* — Locke Lord LLP; Tim Tingkang Xia, Esq.

(57) ABSTRACT

Provided is an anti-interference semiconductor device for an optical transceiver. The semiconductor device includes: a back metallization layer, a p++ bearing wafer layer, a P-type epitaxial layer, an isolation layer and a metal layer arranged from bottom to top. The back metallization layer serves as a substrate, on which the p++ bearing wafer layer is formed. The P-type epitaxial layer is formed on the p++ bearing wafer layer. The metal layer is formed on the isolation layer. The semiconductor device includes at least two N-type heavily doped grooves, two P-type heavily doped grooves and a plurality of deep through-silicon vias, which are formed in the P-type epitaxial layer and the isolation layer. The deep through-silicon vias are distributed and divided into at least two rows. The N-type heavily doped grooves and the P-type heavily doped grooves are alternately arranged at two sides of the deep through-silicon vias.

10 Claims, 2 Drawing Sheets

(56) References Cited

U.S. PATENT DOCUMENTS

2005/0253222 A1* 11/2005 Caneau .................. B82Y 20/00
                       257/607
2015/0311142 A1* 10/2015 Sekar .................. H01L 23/3677
                       257/499
2017/0025408 A1* 1/2017 Schulze .............. H01L 27/0664
2017/0261708 A1* 9/2017 Ding ...................... G02B 6/428

FOREIGN PATENT DOCUMENTS

| CN | 102637713 A |   | 8/2012  |           |
|----|-------------|---|---------|-----------|
| CN | 103688353 A |   | 3/2014  |           |
| CN | 104160498 A |   | 11/2014 |           |
| CN | 104247054 A |   | 12/2014 |           |
| CN | 104422987 A |   | 3/2015  |           |
| CN | 104867905 A |   | 8/2015  |           |
| CN | 105006468 A |   | 10/2015 |           |
| CN | 106252389 A |   | 12/2016 |           |
| CN | 205984995 U |   | 2/2017  |           |
| CN | 106876318 A | * | 6/2017  | H01L 21/265 |

* cited by examiner

ANTI-INTERFERENCE SEMICONDUCTOR DEVICE FOR OPTICAL TRANSCEIVER

CROSS-REFERENCE TO RELATED PATENT APPLICATION

This application is a continuation application of International Patent Application No. PCT/CN2016/098105, filed on Sep. 5, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The invention relates to the field of optical communication, in particular to an anti-interference semiconductor device for an optical transceiver.

BACKGROUND

In an optical communication network, optical transceivers are used to transmit and receive optical signals on optical fibers. An optical transceiver generates an amplitude and/or phase and/or polarization modulated optical signal representing data, and then transmits the optical signal on an optical fiber coupled to the transceiver. Each transceiver includes a transmitter side and a receiver side. On the transmitter side, a laser light source generates laser light, and an optical coupling system receives the laser light and optically couples or images the light onto one end of the optical fiber. The laser light source is generally made of one or more laser diodes that generate light of a specific wavelength or a range of wavelengths. The optical coupling system typically includes one or more reflective elements, one or more refractive elements, and/or one or more diffractive elements. On the receiver side, a photodiode detects an optical data signal transmitted on the optical fiber and converts the optical data signal into an electrical signal, which is then amplified and processed by a circuit on the receiver side to recover the data.

Although various transceiver and fiber link designs enable an increase in the overall bandwidth or data rate of a fiber link, there are limitations on the extent to which currently available technologies can be used to improve the bandwidth of the fiber link. It has been shown that a combination of receiver-based electronic dispersion compensation (EDC) technology and a specific modulation format may be used to increase the bandwidth of the optical fiber link. It is also known that a plurality of optical links may be combined to realize an optical link having a higher data rate than that of each of the individual optical links forming said combination. However, in order to realize this link, multiple groups of parallel optical devices and a corresponding number of optical fibers are required, which significantly increases the costs associated with such links. Therefore, there are difficulties associated with scaling such links to achieve higher and higher bandwidths.

Through silicon via (TSV) technology is the latest technology to realize interconnection between chips by making vertical conduction between chips and between wafers. Unlike the conventional IC package bonding and bump stacking technologies, the TSV technology can maximize the chip stacking density in the three-dimensional direction, minimize the overall size, and greatly improve the chip speed and low power consumption performance.

In the prior art, various devices in an optical transceiver module are usually made into different chips, which is not conducive to improving the chip speed. Therefore, there is a need for an anti-interference semiconductor device for an optical transceiver capable of operating at a relatively high data rate while realizing a relatively low return loss.

SUMMARY

One object of the present invention is to provide an anti-interference semiconductor device for an optical transceiver. The semiconductor device comprises a backside metallization layer, a p++ carrier wafer layer, a P-type epitaxial layer, an isolation layer and a metal layer which are arranged from bottom to top; the backside metallization layer serves as a substrate with the p++ carrier wafer layer formed thereon, the P-type epitaxial layer is formed on the p++ carrier wafer layer, deep through-silicon vias, N-type heavily doped grooves and P-type heavily doped grooves are formed in the P-type epitaxial layer and the isolation layer, and the metal layer is formed on the isolation layer; the semiconductor device comprises at least two N-type heavily doped grooves, two P-type heavily doped grooves and a plurality of deep through-silicon vias, wherein the plurality of deep through-silicon vias are distributed in at least two rows, and the N-type heavily doped grooves and the P-type heavily doped grooves are alternately arranged at two sides of the deep through-silicon vias.

Preferably, the deep through-silicon vias extend from the bottom of the P-type epitaxial layer to the top of the isolation layer.

Preferably, the N-type heavily doped grooves and the P-type heavily doped grooves are formed in the top of the P-type epitaxial layer and extend to the top of the isolation layer.

Preferably, the deep through-silicon vias are of a "V" shape with square openings at both ends, and have a depth range of 8 μm to 12 μm.

Preferably, the deep through-silicon vias have a depth of 10 μm.

Preferably, the distance between the deep through-silicon vias is 2 μm to 3 μm.

Preferably, the N-type heavily doped grooves and the P-type heavily doped grooves are alternately arranged with a spacing distance of 2 μm to 3 μm.

Preferably, after the isolation layer is formed, it is covered with a layer of metal, which sequentially fills the N-type heavily doped grooves, the P-type heavily doped grooves and the deep through-silicon vias which are all V-shaped grooves, and forms a certain thickness above the isolation layer.

Preferably, the metal is selected from aluminum or copper.

Another object of the present invention is to provide an anti-interference optical transceiver module including a semiconductor device as described above, which further includes a laser driver, a transconductance amplifier, and a clock data restorer; the laser driver, the transconductance amplifier and the clock data restorer are separated from each other by the anti-interference semiconductor devices, wherein the clock data restorer is separated from the laser driver and the transconductance amplifier by one group of anti-interference semiconductor devices, and the laser driver is separated from the transconductance amplifier by two groups of anti-interference semiconductor devices.

It should be understood that both the foregoing general description and the following detailed description are illustrative and explanatory, and should not be interpreted as limitations on the claimed disclosure of the present invention.

BRIEF DESCRIPTION OF THE DRAWINGS

Further objects, functions and advantages of the present invention will be elucidated with reference to the embodiments described hereinafter and the accompanying drawings in which.

DETAILED DESCRIPTION

Figure 1:
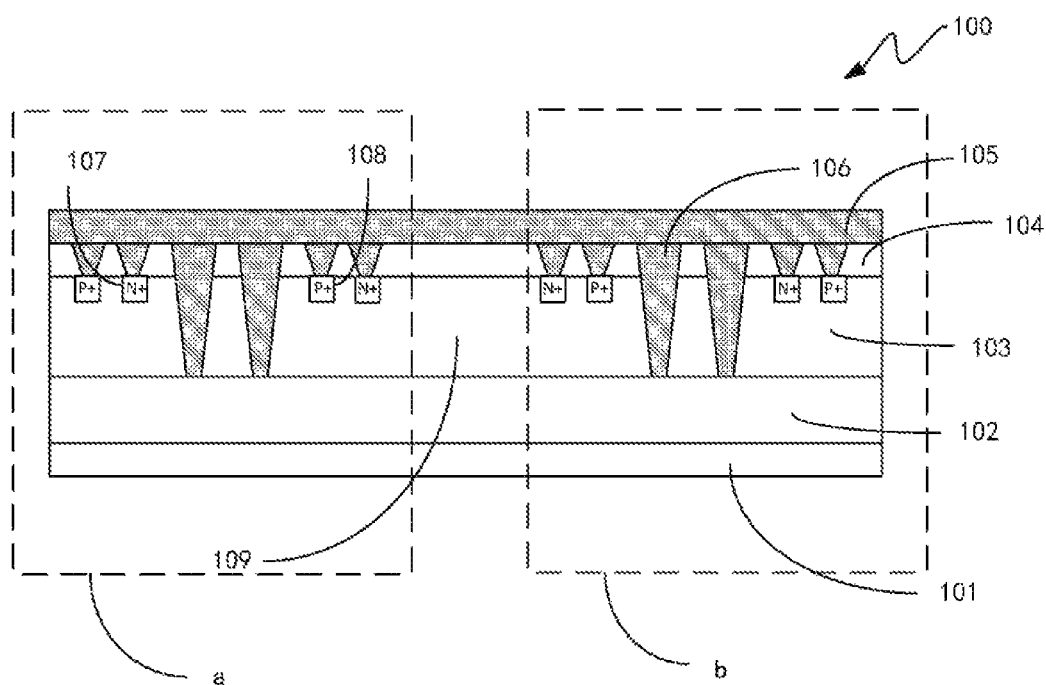
FIG. 1 is an enlarged cross-sectional view of an anti-interference semiconductor device for an optical transceiver according to the present invention.

The objects and functions of the present invention and methods for achieving these objects and functions will be clarified by referring to exemplary embodiments. However, the present invention is not limited to the exemplary embodiments disclosed below, and can be implemented in different forms. The essence of the specification is only to help those skilled in the related fields to comprehensively understand the specific details of the present invention.

Hereinafter, embodiments of the present invention will be described with reference to the accompanying drawings. In the drawings, the same reference numerals represent the same or similar parts, or the same or similar steps.

Figure 2:
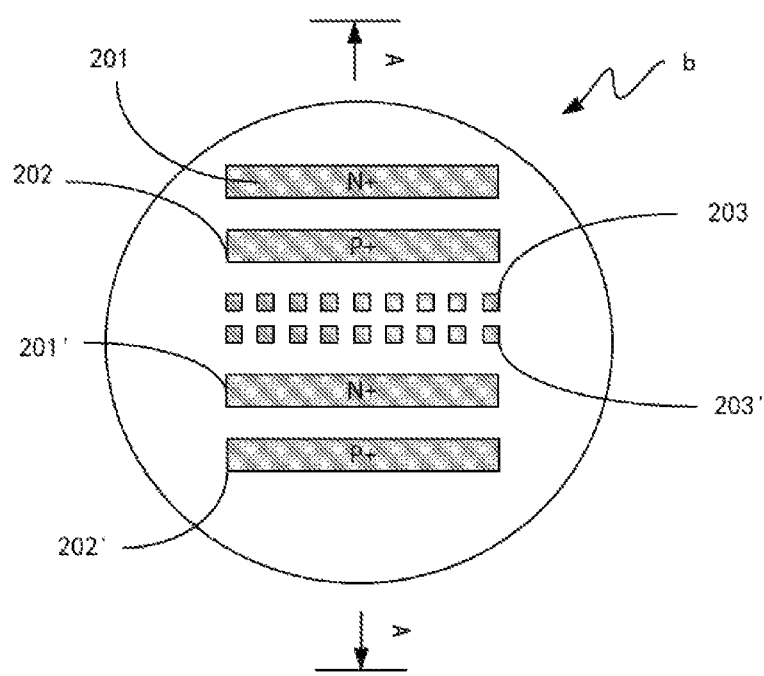
FIG. 2 schematically shows a top view of the anti-interference semiconductor device for the optical transceiver according to the present invention.

FIG. 1 is an enlarged cross-sectional view of an anti-interference semiconductor device for an optical transceiver according to a first embodiment of the present invention. As shown in FIG. 1, the anti-interference semiconductor device 100 includes a backside metallization layer 101, a p++ (heavily doped) carrier wafer layer 102, a p-type epitaxial layer 103, an isolation layer 104, and a metal layer 105 arranged from bottom to top. The backside metallization layer 101 serves as a substrate with the p++ carrier wafer layer 102 formed thereon. The P-type epitaxial layer 103 is formed on the p++ carrier wafer layer 102. Deep through-silicon vias 106, N-type heavily doped grooves (N+) 107, and P-type heavily doped grooves (P+) 108 are formed in the P-type epitaxial layer 103 and the isolation layer 104. The deep through-silicon vias 106 extend from the bottom of the P-type epitaxial layer 103 to the top of the isolation layer 104. A plurality of deep through-silicon vias 106 are distributed in at least two rows, as shown in FIG. 2. The N-type heavily doped grooves (N+) 107 and the P-type heavily doped grooves (P+) 108 are alternately arranged on both sides of the deep through-silicon vias. The N-type heavily doped grooves (N+) 107 and the P-type heavily doped grooves (P+) 108 are formed in the top of the P-type epitaxial layer 103 and extend to the top of the isolation layer 104. After the isolation layer 104 is formed, it is covered with a layer of metal, which sequentially fills the N-type heavily doped grooves, the P-type heavily doped grooves and the deep through-silicon vias 106 which are all V-shaped grooves, and forms a certain thickness above the isolation layer 104, namely the metal layer 105. Preferably, the metal may be selected from aluminum or copper.

The deep through-silicon vias 106 are of a "V" shape with square openings at both ends, and have a depth range of 8-12 μm, preferably 10 μm. The deep through-silicon vias 106 are provided in pairs between the metal layer 105 and the p++ carrier wafer layer 102, passing through the P-type epitaxial layer 103. In a plan view of the anti-interference semiconductor device 100, the deep through-silicon vias 106 are two rows of small holes with square cross sections, as shown in FIG. 2. The distance between each two rows of deep through-silicon vias is 2 μm to 3 μm.

The N-type heavily doped grooves 107 and the P-type heavily doped grooves 108 are alternately arranged on both sides of the two rows of deep through-silicon vias 106. The N-type heavily doped grooves and the P-type heavily doped grooves are strip-shaped grooves with V-shaped cross sections, as shown in the top view of FIG. 2. Two N-type heavily doped grooves and two P-type heavily doped grooves are distributed on both sides of each two rows of deep through-silicon vias 106. The N-type heavily doped grooves and the P-type heavily doped grooves are arranged alternately with a spacing distance of 2 μm to 3 μm. There are actually two groups of anti-interference semiconductor devices (shown by dashed boxes a and b) in FIG. 1, and a region 109 between the two groups of anti-interference semiconductor devices a and b is a protected region.

FIG. 2 schematically shows a top view of the anti-interference semiconductor device for the optical transceiver according to the present invention (a group of anti-interference semiconductor devices). As can be seen from FIG. 2, the anti-interference semiconductor device includes two columns of N-type heavily doped grooves (N+) 201 and 201', P-type heavily doped grooves (P+) 202 and 202', and deep through-silicon vias 203 and 203'. As shown in FIG. 2, if the cross-section obtained along a direction A-A is defined as a cross-section, then the N+ and P+ are grooves with a V-shaped cross-section, and the deep through-silicon vias are through vias which have a deep V-shaped cross-section (FIG. 1) and are square in the top view.

Figure 3:
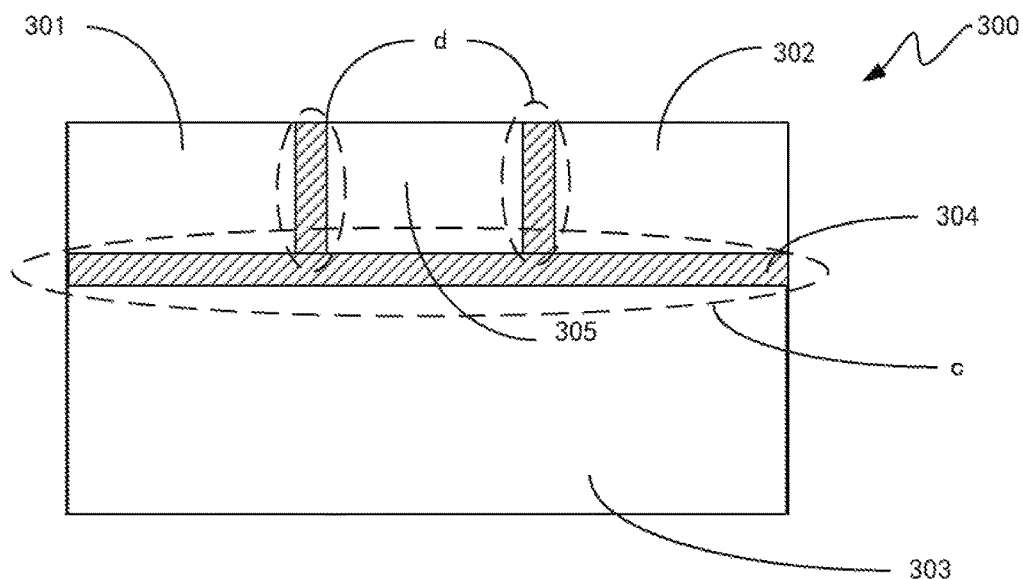
FIG. 3 is a top view of a first embodiment to which the anti-interference semiconductor device for the optical transceiver of the present invention is applied.

FIG. 3 is a schematic view of a first embodiment to which the anti-interference semiconductor device for the optical transceiver of the present invention is applied. As shown in FIG. 3, an anti-interference optical transceiver module 300 includes a laser driver 301, a transconductance amplifier 302, a clock data restorer 303, and an anti-interference semiconductor device 304. As shown in FIG. 3, the first embodiment of the present invention has a rectangular top surface. The laser driver 301 and the transconductance amplifier 302 are respectively located at two corners of one long side of the rectangle, and the clock data restorer 303 is located on the other long side of the rectangle. The anti-interference semiconductor device 304 includes a c portion and a d portion, wherein the clock data restorer 303 is separated from the laser driver 301 and the transconductance amplifier 302 by the c portion of the anti-interference semiconductor device 304. Between the laser driver 301 and the transconductance amplifier 302, there are arranged two anti-interference semiconductor devices, i.e. the d portions of the anti-interference semiconductor devices 304. The region in the middle of the d portion of the anti-interference semiconductor device 304 is a protected region 305.

Figure 4:
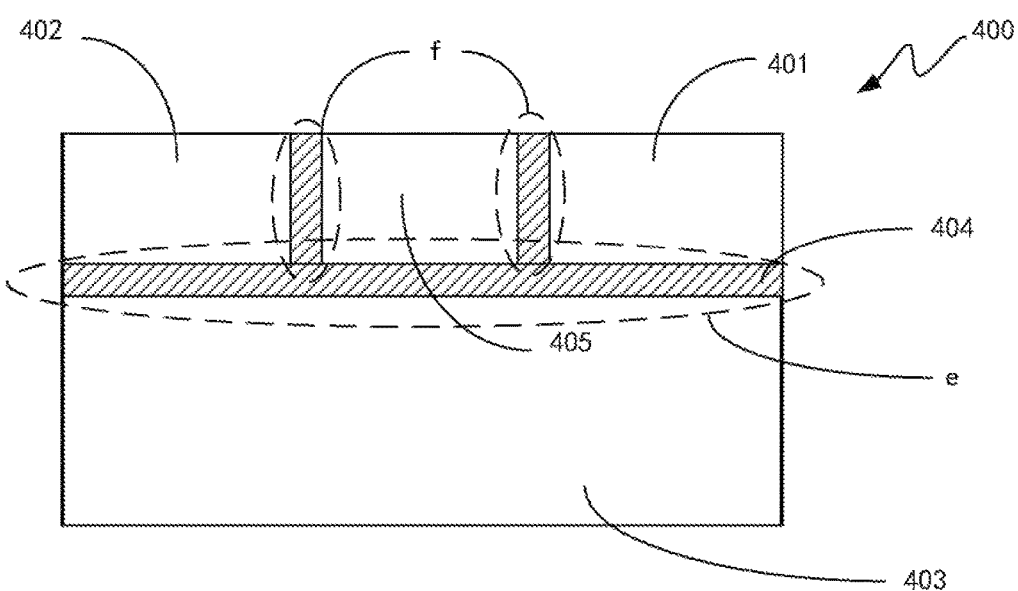
FIG. 4 is a top view of a second embodiment to which the anti-interference semiconductor device for the optical transceiver of the present invention is applied.

FIG. 4 is a schematic view of a second embodiment to which the anti-interference semiconductor device for the optical transceiver of the present invention is applied. As shown in FIG. 4, an anti-interference optical transceiver module 400 of the second embodiment includes a transconductance amplifier 401, a laser driver 402, a clock data restorer 403, and an anti-interference semiconductor device 404. As shown in FIG. 4, the anti-interference optical transceiver module according to the second embodiment of the present invention has a rectangular top surface. The transconductance amplifier 401 and the laser driver 402 are respectively located at two corners of one long side of the rectangle (the positions of the transconductance amplifier and the laser driver in this embodiment are reversed with respect to the positions of those in the first embodiment), and the clock data restorer 403 is located on the other long side of the rectangle. The anti-interference semiconductor device 404 includes an e portion and an f portion, wherein the clock data restorer 403 is separated from the transconductance amplifier 401 and the laser driver 402 by the e portion of the anti-interference semiconductor device 404. Between the transconductance amplifier 401 and the laser driver 402, there are arranged two anti-interference semiconductor devices, i.e., the f portions of the anti-interference semiconductor devices 404. The region in the middle of the f portion of the anti-interference semiconductor device 404 is a protected region 405.

According to the anti-interference semiconductor device for the optical transceiver, the laser driver, the transconductance amplifier and the clock data restorer are integrated on one chip, so that not only can the cost be saved, but also the chip speed and power consumption performance can be greatly improved, and relatively high data rate operation and relatively low return loss can be realized. By using the through silicon via technology, various devices on the same chip can be isolated and be protected against interference.

Other embodiments of the present invention will be readily apparent to and understood by those skilled in the art in light of the description and practice of the invention disclosed herein. The description and embodiments are to be considered as exemplary only, and the true scope and spirit of the invention are defined by the claims.

What is claimed is:

1. An anti-interference semiconductor device for an optical transceiver, the semiconductor device comprising a backside metallization layer, a p++ carrier wafer layer, a P-type epitaxial layer, an isolation layer and a metal layer which are arranged from bottom to top; the backside metallization layer serves as a substrate with the p++ carrier wafer layer formed thereon, the P-type epitaxial layer is formed on the p++ carrier wafer layer, deep through-silicon vias, N-type heavily doped grooves and P-type heavily doped grooves are formed in the P-type epitaxial layer and the isolation layer, and the metal layer is formed on the isolation layer; the semiconductor device comprises at least two N-type heavily doped grooves, two P-type heavily doped grooves and a plurality of deep through-silicon vias, wherein the plurality of deep through-silicon vias are distributed in at least two rows, and the N-type heavily doped grooves and the P-type heavily doped grooves are alternately arranged at two sides of the deep through-silicon vias.

2. The anti-interference semiconductor device for the optical transceiver according to claim 1, wherein the deep through-silicon vias extend from the bottom of the P-type epitaxial layer to the top of the isolation layer.

3. The anti-interference semiconductor device for the optical transceiver according to claim 1, wherein the N-type heavily doped grooves and the P-type heavily doped grooves are formed in the top of the P-type epitaxial layer and extend to the top of the isolation layer.

4. The anti-interference semiconductor device for the optical transceiver according to claim 1, wherein the deep through-silicon vias are of a "V" shape with square openings at both ends, and have a depth range of 8 μm to 12 μm.

5. The anti-interference semiconductor device for the optical transceiver according to claim 1, wherein the deep through-silicon vias have a depth of 10 μm.

6. The anti-interference semiconductor device for the optical transceiver according to claim 1, wherein the distance between the deep through-silicon vias is 2 μm to 3 μm.

7. The anti-interference semiconductor device for the optical transceiver according to claim 1, wherein the N-type heavily doped grooves and the P-type heavily doped grooves are alternately arranged with a spacing distance of 2 μm to 3 μm.

8. The anti-interference semiconductor device for the optical transceiver according to claim 1, wherein after the isolation layer is formed, it is covered with a layer of metal, which sequentially fills the N-type heavily doped grooves, the P-type heavily doped grooves and the deep through-silicon vias which are all V-shaped grooves, and forms a certain thickness above the isolation layer.

9. The anti-interference semiconductor device for the optical transceiver according to claim 8, wherein the metal is selected from aluminum or copper.

10. An anti-interference optical transceiver module comprising the semiconductor device according to claim 1, further comprising a laser driver, a transconductance amplifier, and a clock data restorer; the laser driver, the transconductance amplifier and the clock data restorer are separated from each other by the anti-interference semiconductor devices, wherein the clock data restorer is separated from the laser driver and the transconductance amplifier by one group of anti-interference semiconductor devices, and the laser driver is separated from the transconductance amplifier by two groups of anti-interference semiconductor devices.

* * * * *